(12) United States Patent
Yuri et al.

(10) Patent No.: US 7,078,737 B2
(45) Date of Patent: Jul. 18, 2006

(54) LIGHT-EMITTING DEVICE

(75) Inventors: Masaaki Yuri, Ibaraki (JP); Daisuke Ueda, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/652,999

(22) Filed: Aug. 29, 2003

(65) Prior Publication Data

US 2004/0041159 A1 Mar. 4, 2004

(30) Foreign Application Priority Data

Sep. 2, 2002 (JP) ............................... 2002-256513

(51) Int. Cl.
*H01L 33/00* (2006.01)

(52) U.S. Cl. .................. 257/99; 257/749; 438/22
(58) Field of Classification Search .......... 257/79, 257/80, 81, 82, 88, 98, 99, 100, 741, 749, 257/773, 91, 786; 438/22, 25, 26
See application file for complete search history.

(56) References Cited

U.S. PATENT DOCUMENTS

| | | | | |
|---|---|---|---|---|
| 5,261,013 A | * | 11/1993 | Murata et al. | 358/471 |
| 5,323,084 A | * | 6/1994 | Haitz | 313/500 |
| 5,656,847 A | * | 8/1997 | Okazaki et al. | 257/433 |
| 6,153,448 A | * | 11/2000 | Takahashi et al. | 438/114 |
| 6,482,664 B1 | | 11/2002 | Lee et al. | |
| 6,504,180 B1 | * | 1/2003 | Heremans et al. | 257/98 |
| 6,570,180 B1 | * | 5/2003 | Okada et al. | 257/40 |
| 6,593,598 B1 | * | 7/2003 | Ishinaga | 257/98 |
| 6,744,194 B1 | | 6/2004 | Fukasawa et al. | |

FOREIGN PATENT DOCUMENTS

| | | |
|---|---|---|
| JP | 51-37571 | 3/1976 |
| JP | 63-164482 | 7/1988 |
| JP | 3-21983 | 1/1991 |
| JP | 9-64466 | 3/1997 |
| JP | 10-223021 | 8/1998 |
| JP | 11-298048 | 10/1999 |
| JP | 2000-200928 | 7/2000 |
| JP | 2001-77430 | 3/2001 |
| JP | 2001-203392 | 7/2001 |
| JP | 2001-305535 | 10/2001 |
| JP | 2001-345482 | 12/2001 |
| JP | 2002-76444 | 3/2002 |
| JP | 2002-111073 | 4/2002 |

* cited by examiner

*Primary Examiner*—B. William Baumeister
*Assistant Examiner*—Dana Farahani
(74) *Attorney, Agent, or Firm*—Hamre, Schumann, Mueller & Larson, P.C.

(57) ABSTRACT

An InGaN-based light-emitting diode that emits light in blue, for example, is mounted on a support substrate as a semiconductor light-emitting element, and a transparent film is fixed to the support substrate so as to cover the semiconductor light-emitting element. An electrode pattern is formed on an upper surface of the transparent film, and the electrode pattern is electrically connected to terminal electrodes of the semiconductor light-emitting element through, for example, through-holes. The transparent film can contain a phosphor excited by light emitted from the semiconductor light-emitting element. It is not necessary to perform wire bonding for connecting the semiconductor light-emitting element to the electrode pattern and sealing with a sealant.

18 Claims, 5 Drawing Sheets

LIGHT-EMITTING DEVICE

BACKGROUND OF THE INVENTION

1. Field of the Invention

The present invention relates to a technique of mounting a semiconductor light-emitting element such as a light-emitting diode and a plane-emitting laser that can be used in, for example, a semiconductor device, an illumination device, a display device, and the like.

2. Description of the Related Art

In recent years, due to the advancement of semiconductor technology, a light-emitting diode and a plane-emitting diode that emit light in a blue to ultraviolet short-wavelength range have been realized. By using them, white light sources utilizing the excitation of phosphors are being developed extensively. For example, white light can be obtained by coating a blue light-emitting diode with a phosphor that emits light in yellow. Because of this, white light sources are being put into practical use for various kinds of displays and illumination. Furthermore, the following attempt also has been made: an ultraviolet light-emitting diode with a wavelength of 300 to 400 nm is used as a light source, and phosphors of three primary colors of red, green, and blue are excited by the diode, whereby more natural white color is obtained.

Various methods have been proposed for mounting the above-mentioned type of a light-emitting device composed of a light-emitting diode and a phosphor, (e.g., JP 11(1999)-298048 A, JP 2002-76444 A, etc.). Hereinafter, the configuration of a conventional white light-emitting device including the above-mentioned combination of a light-emitting diode and phosphor will be described with reference to FIG. 8.

Figure 8:
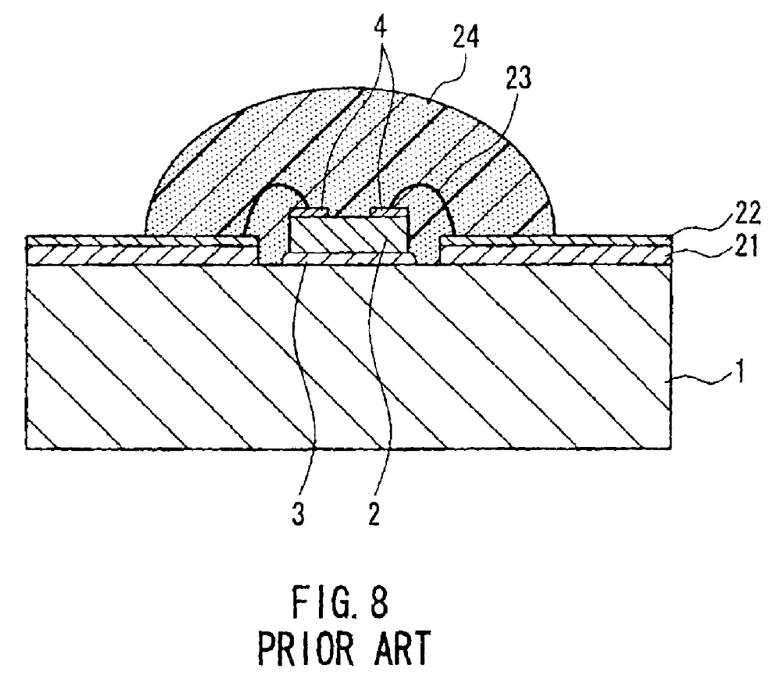
FIG. 8 is a cross-sectional view of a conventional light-emitting device.

FIG. 8 is a cross-sectional view showing an exemplary configuration of the conventional white light-emitting device. A blue light-emitting diode 2 is mounted with a silver paste 3 on a support substrate 1 on which an electrode pattern 22 is formed via an insulating film 21. Terminal electrodes 4 are formed on a surface of the light-emitting diode 2, and the terminal electrodes 4 are electrically connected to the electrode pattern 22 on the support substrate 1 with gold wires 23. Furthermore, a sealant 24 containing a phosphor is formed so as to cover the light-emitting diode 2.

When electric power is supplied to the light-emitting diode 2 through the electrode pattern 22, the light-emitting diode 2 emits light in blue. A part of the light is absorbed by the phosphor in the sealant 24, whereby the phosphor emits light in yellow. The yellow light emitted from the phosphor is mixed with a part of the blue light transmitted through the sealant 24 to obtain a white light source.

However, the above-mentioned configuration has the following problems. With this configuration, wire bonding is required for forming the gold wires 23. Furthermore, during wire bonding, an excess stress may be applied to the light-emitting diode 2 and degrade it. Furthermore, with the conventional configuration, it is required that the sealant 24 is formed after wire bonding, which increases a production cost.

Furthermore, due to the stress generated when the sealant 24 is cured, the gold wires 23 may be disconnected from the terminal electrodes 4 or the electrode pattern 22. These problems lead to main factors for decreasing a yield in a light-emitting device, particularly in which a number of light-emitting diodes are arranged in an array. Furthermore, with the conventional configuration, it is difficult to decrease the thickness of a device due to the presence of the gold wires 23.

SUMMARY OF THE INVENTION

Therefore, with the foregoing in mind, it is an object of the present invention to provide a light-emitting device with reduced thickness as a whole that can be produced with a good yield at a low cost, without requiring processes of wire bonding and forming a sealant containing a phosphor.

In order to solve the above-mentioned problems, a light-emitting device of the present invention includes: a support substrate, a semiconductor light-emitting element mounted on the support substrate, a transparent film fixed to the support substrate so as to cover the semiconductor light-emitting element, and an electrode pattern formed on an upper surface of the transparent film, wherein the electrode pattern is electrically connected to terminal electrodes of the semiconductor light-emitting element.

These and other advantages of the present invention will become apparent to those skilled in the art upon reading and understanding the following detailed description with reference to the accompanying figures.

DESCRIPTION OF THE PREFERRED EMBODIMENTS

The light-emitting device of the present invention is characterized in that a transparent film is placed so as to cover a semiconductor light-emitting element mounted on a support substrate, and an electrode pattern formed on an upper surface of the transparent film is electrically connected to terminal electrodes of the semiconductor light-emitting element. This makes it unnecessary to perform wire bonding for connecting the semiconductor light-emitting element to the electrode pattern in the course of production and sealing with a sealant, whereby a thin light-emitting device can be produced with a good yield at a low cost.

In the light-emitting device with the above-mentioned configuration, it is preferable that the transparent film contains a phosphor excited by light emitted from the semiconductor light-emitting element. Because of this, the process of forming a sealant containing a phosphor is omitted, whereby a light-emitting device can be produced at a low cost.

Furthermore, it is preferable that a phosphor film containing a phosphor excited by light emitted from the semiconductor light-emitting element is formed on at least one surface of the transparent film. Because of this, the process of forming a sealant containing a phosphor is omitted, whereby a light-emitting device can be produced at a low cost. Furthermore, the degradation of strength caused by allowing the transparent film to contain a large amount of phosphor can be prevented, and any amount of phosphor can be used. Furthermore, it is preferable that the phosphor film is formed on a surface of the transparent film on the semiconductor light-emitting element side. Because of this, in particular, when a light-emission wavelength of the light-emitting diode is in an ultraviolet range, light from the light-emitting diode can be converted to visible light by a phosphor before passing through the transparent film. Therefore, the loss of light caused by absorption by the transparent film can be reduced to enhance a light-emission efficiency.

Furthermore, it is preferable that the support substrate has a concave portion, and the semiconductor light-emitting element is mounted in the concave portion. Because of this, the transparent film is bent less, and a light-emitting device can be produced with a good yield. It is preferable that a side wall surface of the concave portion is formed so as to spread outwardly from a bottom portion toward the transparent film. Because of this, light emitted from a side surface of the light-emitting element is reflected from the side wall slope of the concave portion to be guided to the transparent film. Therefore, the light extraction efficiency and light-emission efficiency can be enhanced. It is preferable that an angle formed by the side wall surface of the concave portion and an upper surface of the support substrate is in a range of 30° to 60°.

In the light-emitting device with the above-mentioned configuration, at least one of the terminal electrodes of the semiconductor light-emitting element can be connected electrically to the support substrate or an electrode formed on the support substrate. Because of this, the light-emitting diode is connected to the electrode on the transparent film only at one point, so that the shielding against light by the electrode on the transparent film can be minimized to enhance a light-emission efficiency.

Furthermore, in the light-emitting device with the above-mentioned configuration, a plurality of the semiconductor light-emitting elements may be mounted in an array on the support substrate. Because of this, a light-emitting device with a large output can be configured easily.

Furthermore, in the light-emitting device with the above-mentioned configuration, the transparent film can be fixed to the support substrate with an adhesive. Because of this, the transparent film can be fixed strongly, and the light-emitting elements can be shielded against outside air to minimize the exposure to moisture and the like. Therefore, the reliability of the light-emitting diode can be enhanced. It is preferable that the adhesive contains a phosphor excited by light emitted from the semiconductor light-emitting element. Because of this, light emitted and leaking from the side surface of the light-emitting diode can be converted to visible light by a phosphor, so that a light-emission efficiency can be enhanced.

In the light-emitting device with the above-mentioned configuration, the support substrate can be made of metal. Because of this, the heat radiation characteristics of the light-emitting diode are enhanced remarkably, and a highest working temperature and reliability can be enhanced.

Furthermore, in the light-emitting device with the above-mentioned configuration, it is preferable that resin is sealed in a space surrounded by the support substrate and the transparent film. Because of this, when the resin is cured to shrink, the resin attracts the transparent film to the support substrate side. Therefore, a mounting state is strengthened, and a light-emitting device with high reliability can be realized. Furthermore, it is preferable that the resin sealed in the space contains a phosphor excited by light emitted from the semiconductor light-emitting element. Because of this, light emitted from the side surface of the light-emitting diode also can be converted to visible light by a phosphor to enhance a light-emission efficiency. Furthermore, it is preferable that a refractive index of the resin sealed in the space is smaller than that of a light-emitting portion of the semiconductor light-emitting element and larger than that of the transparent film. Because of this, a light extraction efficiency from the light-emitting diode is enhanced, whereby a light-emission efficiency can be enhanced.

In the light-emitting device with the above-mentioned configuration, it is preferable that gas is sealed in the space surrounded by the support substrate and the transparent film at a pressure lower than an atmospheric pressure. Because of this, the transparent film is attracted to the support substrate side. Therefore, a mounting state is strengthened, and a light-emitting device with high reliability can be realized.

Furthermore, in the light-emitting device with the above-mentioned configuration, it is preferable that inactive gas selected from the group consisting of nitrogen, argon, helium, and a mixture thereof is sealed in the space surrounded by the support substrate and the transparent film. Because of this, particularly, in the case where the light-emitting diode emits light in an ultraviolet range, the degradation of an electrode of the light-emitting diode due to the presence of oxygen and moisture in air can be prevented, and a light-emitting device with high reliability can be realized.

Hereinafter, a light-emitting device in each embodiment of the present invention will be described specifically with reference to the drawings.

Embodiment 1

Figure 1A:
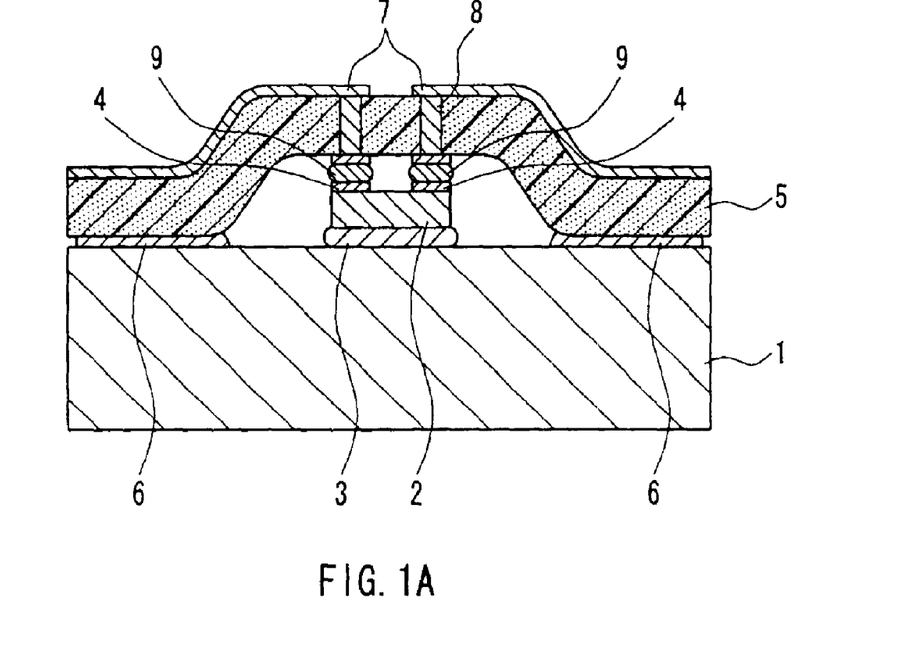
FIG. 1A is a cross-sectional view of a light-emitting device according to Embodiment 1 of the present invention.
Figure 1B:
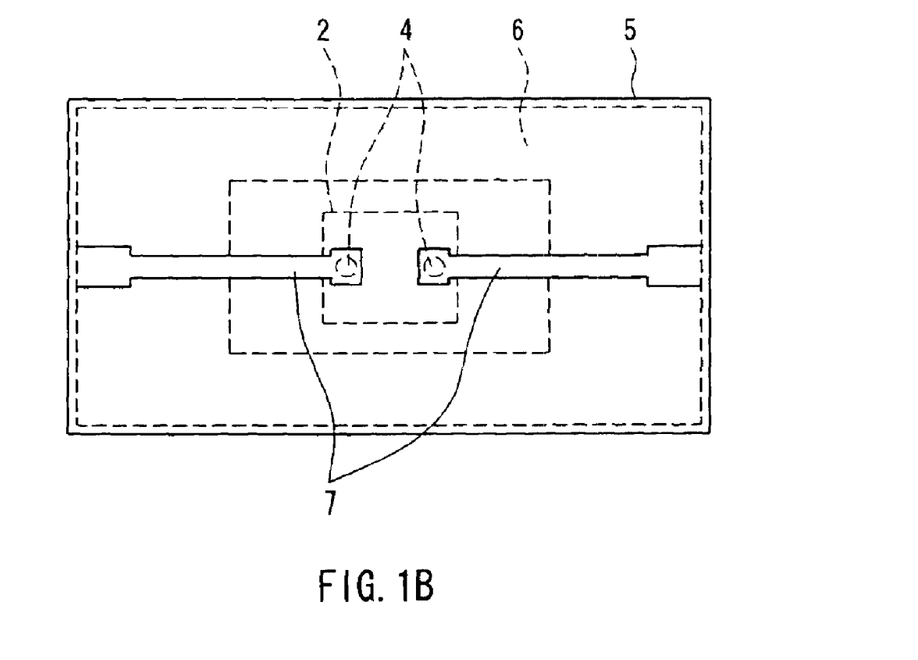
FIG. 1B is a plan view of the same light-emitting device.

FIG. 1A is a cross-sectional view showing a light-emitting device according to Embodiment 1 of the present invention, and FIG. 1B is a plan view thereof. A semiconductor light-emitting element, such as an InGaN-based light-emitting diode 2 that emits light in blue, is fixed to a support substrate 1 with a silver paste 3. A transparent film 5 made of resin that is transparent to blue light is placed so as to cover an upper portion of the light-emitting diode 2, and fixed to the support substrate 1 with an adhesive 6. An electrode pattern 7 is formed on a surface of the transparent film 5. The electrode pattern 7 extends to a reverse surface of the transparent film 5 through through-holes 8 immediately above the light-emitting diode 2, and is electrically connected to terminal electrodes 4 of the light-emitting diode 2 through gold bumps 9. A powdery phosphor pigment is mixed in the transparent film 5 in a ratio in accordance with the level of white light to be obtained.

According to the above-mentioned configuration, wire bonding is not required, and mounting can be performed very efficiently. Furthermore, it is possible to avoid a reduction in yield due to the peeling of a wire or the degradation of the light-emitting diode caused by distortion. Furthermore, since a wire is not required, the entire thickness can be decreased. Furthermore, a process of phosphor coating is not required, which decreases the number of processes, whereby a light-emitting device can be produced with a good yield at a low cost.

The transparent film 5 is fixed to the support substrate 1 with the light-emitting diode 2 interposed therebetween, so that a portion corresponding to the light-emitting diode 2 is deformed to some degree. However, this will not cause any substantial problem in terms of a configuration since the thickness of the light-emitting diode 2 is very small.

The light-emitting diode 2 is not limited to the above-mentioned example, and can be selected variously in accordance with the purpose. Examples of the transparent film 5 include methyl polymethacrylate, polyvinylidene chloride, polyester, polyvinyl alcohol, uniaxially drawn polyester, non-axis polyester, polyarylate, polyether sulfone, polycarbonate, cyclic amorphous polyolefin, polyimide, and other fine plastic materials. The powdery phosphor pigment to be mixed in the transparent film 5 can be selected appropriately in combination with the light-emitting diode 2. Examples of a red phosphor include $(Y, Gd)BO_3:Eu$, $Y_2O_3:Eu$, and the like. Examples of a green phosphor include $Zn_2SiO_4:Mn$, $BaAl_{12}O_{19}:Mn$, and the like. Examples of a blue phosphor include $BaMgAl_{14}O_{23}:Eu$, and the like.

Embodiment 2

Figure 2:
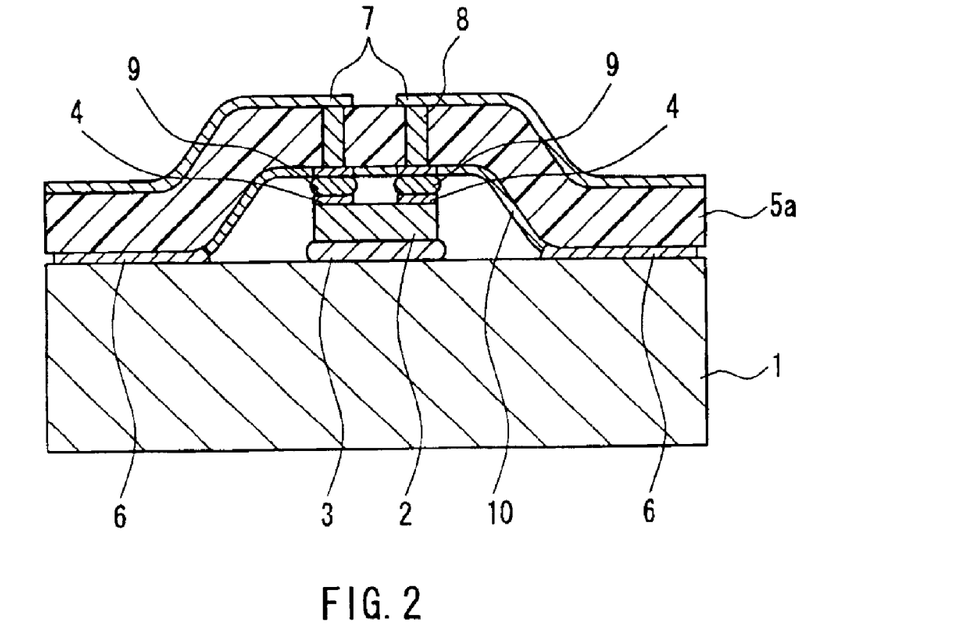
FIG. 2 is a cross-sectional view of a light-emitting device according to Embodiment 2 of the present invention.

FIG. 2 is a cross-sectional view showing a light-emitting device according to Embodiment 2 of the present invention. Embodiment 2 is different from Embodiment 1 in that a transparent film 5*a* does not contain a phosphor pigment, and a phosphor film 10 is formed in a thin film shape on a surface of the transparent film 5*a*.

According to the above-mentioned configuration, the strength of the transparent film 5*a* can be prevented from being degraded when a large amount of phosphor is contained in the transparent film 5*a*. Furthermore, any amount of phosphor can be used.

The phosphor film 10 may be provided on an upper surface of the transparent film 5*a*. However, in the case where the phosphor film 10 is provided on a lower surface of the transparent film 5*a* (i.e., on a surface of the transparent film 5*a* on the light-emitting diode 2 side), the following advantage is obtained. Light emitted from the light-emitting diode 2 can be converted to visible light on a wavelength side longer than a light-emission peak of the light-emitting diode 2 by the phosphor film 10. Because of this, the loss of light absorption by the transparent film 5*a* can be decreased, and a light-emission efficiency can be enhanced. Furthermore, when the light-emission spectrum of the light-emitting diode 2 is outside of an ultraviolet range, degradation of the transparent film 5*a* due to ultraviolet light with the passage of time can be suppressed, whereby a light-emitting device with high reliability can be realized.

The phosphor film 10 can be formed by any film-formation method such as a thin film formation technique, coating, etc.

Embodiment 3

Figure 3:
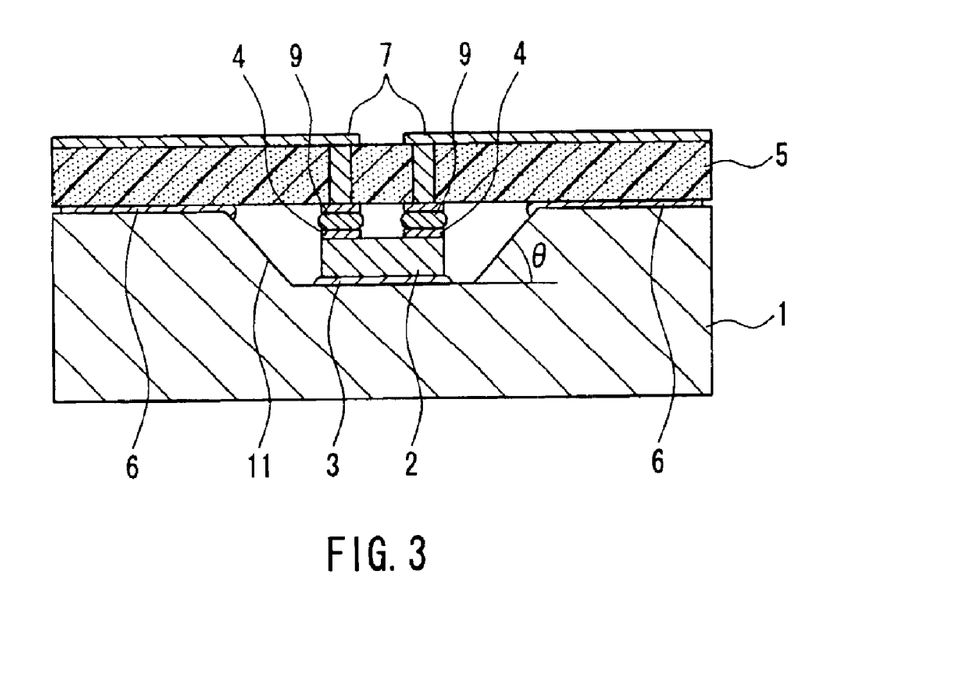
FIG. 3 is a cross-sectional view of a light-emitting device according to Embodiment 3 of the present invention.

FIG. 3 is a cross-sectional view of a light-emitting device according to Embodiment 3 of the present invention. Embodiment 3 is different from Embodiment 1 in that a concave portion 11 is formed in the support substrate 1, and the light-emitting diode 2 is mounted on a bottom surface of the concave portion 11. For example, aluminum is used for the support substrate 1, and the concave portion 11 of about 1 mm on each side and a depth of about 100 µm substantially equivalent to the thickness of the light-emitting diode 2 can be formed by press forming. Strictly, the depth of the concave portion 11 is greater than the thickness of the light-emitting diode 2. However, a total thickness of the silver paste 3, the terminal electrodes 4, and the gold bumps 9 is substantially negligible.

With the above-mentioned configuration, light emitted sideways from the light-emitting diode 2 is allowed to be reflected from side walls of the concave portion 11 to be guided to the transparent film 5 effectively. Because of this, a light-emitting device with a high light-emission efficiency can be realized. In terms of a light extraction efficiency, it is desirable that the side walls of the concave portion 11 spread outwardly from the bottom surface thereof toward the transparent film 5 as shown in FIG. 3. An angle θ formed by the surface of the side wall of the concave portion 11 with respect to the upper surface of the support substrate 1 preferably is 30° to 60°. Furthermore, if a reflective film is provided on the side walls of the concave portion 11, a light extraction efficiency can be enhanced further.

Furthermore, with the above-mentioned configuration, the transparent film 5 can be fixed substantially in a flat state with its bending minimized. Because of this, the degradation of the transparent film 5 due to a local excess stress therein caused by bending and the peeling of the electrode pattern 7 can be avoided.

Embodiment 4

Figure 4:
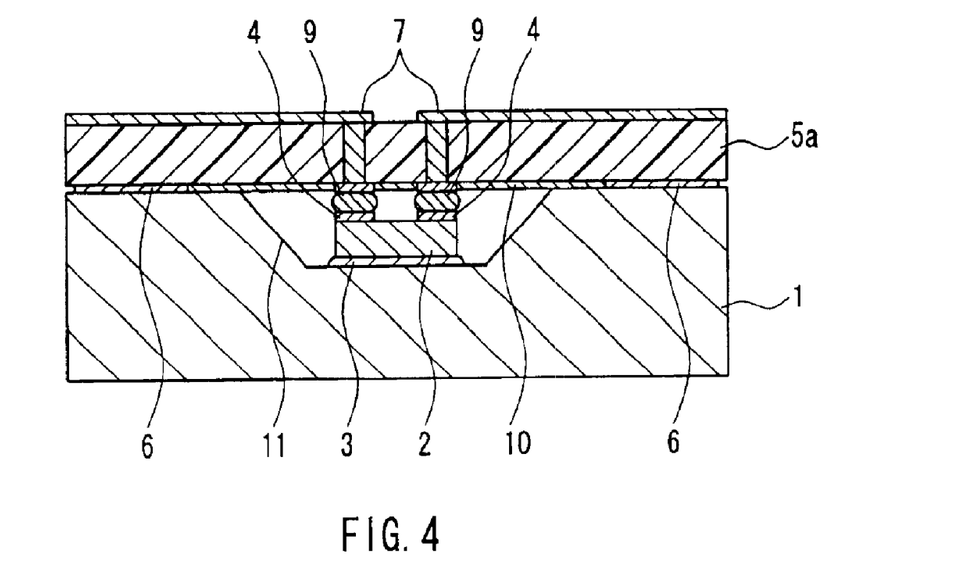
FIG. 4 is a cross-sectional view of a light-emitting device according to Embodiment 4 of the present invention.

FIG. 4 is a cross-sectional view of a light-emitting device according to Embodiment 4 of the present invention. In the present embodiment, the concept of Embodiment 2 is applied to the configuration of Embodiment 3. More specifically, Embodiment 4 is different from Embodiment 3 in that the transparent film 5*a* does not contain a phosphor pigment, and the phosphor film 10 is formed on a surface of the transparent film 5*a* in a thin film shape According to the above-mentioned configuration, as described in Embodiment 2, the degradation of strength of the transparent film 5*a* caused in the case where a large amount of phosphor is contained in the transparent film 5*a* can be avoided, and any amount of phosphor can be used. The advantage obtained by providing the phosphor film 10 on a lower surface of the transparent film 5*a* is the same as that of Embodiment 2.

Embodiment 5

Figure 5:
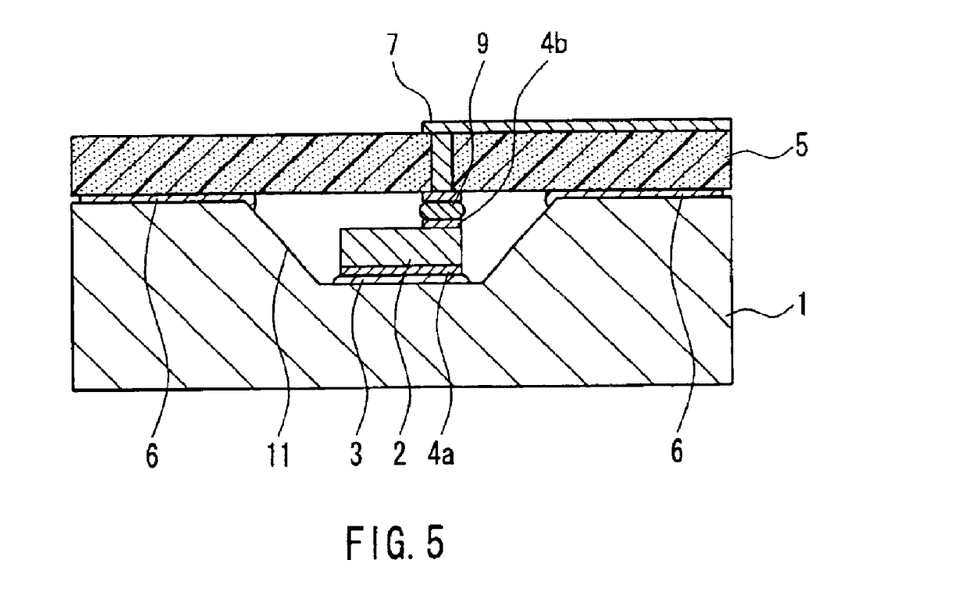
FIG. 5 is a cross-sectional view of a light-emitting device according to Embodiment 5 of the present invention.

FIG. 5 is a cross-sectional view of a light-emitting device according to Embodiment 5 of the present invention. The support substrate 1 is made of aluminum, and the concave portion 11 is formed by press forming in the same way as in Embodiments 3 and 4.

Embodiment 5 is different from Embodiment 3 in that two terminal electrodes 4*a* and 4*b* of the light-emitting diode 2 are formed on lower and upper surfaces of the light-emitting diode 2, the terminal electrode 4*a* is connected to the support substrate 1, and the terminal electrode 4*b* is connected to the electrode pattern 7 on the transparent film 5.

According to the above configuration, the light-emitting diode 2 is electrically connected to the electrode pattern 7 at only one point. Because of this, a mounting yield can be enhanced, and the area of the light-emitting diode 2 shielded against light by the electrode pattern 7 is reduced to a half, so that a light-emitting device with a higher efficiency can be realized.

In the above-mentioned light-emitting device, the support substrate 1 is made of aluminum that is conductive metal is used so as to be electrically connected to the terminal electrode 4*a*. However, the present invention is not limited thereto. For example, an insulating substrate with an electrode pattern formed thereon may be electrically connected to the terminal electrode 4*a*.

In order to connect the terminal electrode 4*a* to the support substrate 1 or to an electrode provided on the support substrate 1, it is not necessarily required that the terminal electrode 4*a* is placed on a lower surface of the light-emitting diode 2. Even in the case where the terminal electrode 4*a* is provided on an upper surface of the light-emitting diode 2, the terminal electrode 4a can be connected to the support substrate 1 and the like through a through-hole of the light-emitting diode or the like.

The connecting structure as mentioned above can be applied to a device of a type different from the above-mentioned light-emitting device in which the concave portion 11 is provided in the support substrate 1. Even in the case where a flat support substrate is used in the same way as in Embodiment 1, the same effect can be obtained by applying the configuration of the present embodiment.

Furthermore, even in the case where the transparent film 5a with the phosphor film 10 formed thereon is used in place of the transparent film 5 containing a phosphor pigment in the same way as in Embodiment 2, the same effect can be obtained by applying the present embodiment.

Embodiment 6

Figure 6A:
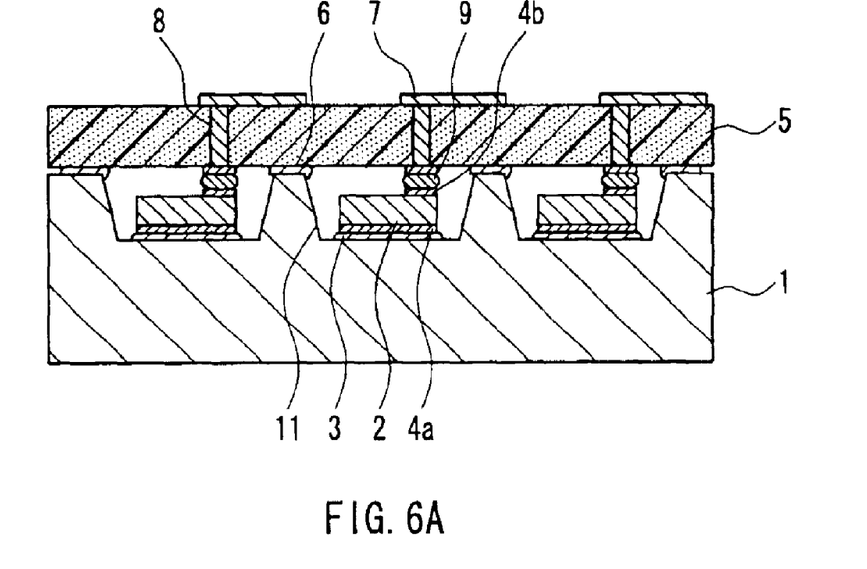
FIG. 6A is a cross-sectional view of a light-emitting device according to Embodiment 6 of the present invention.
Figure 6B:
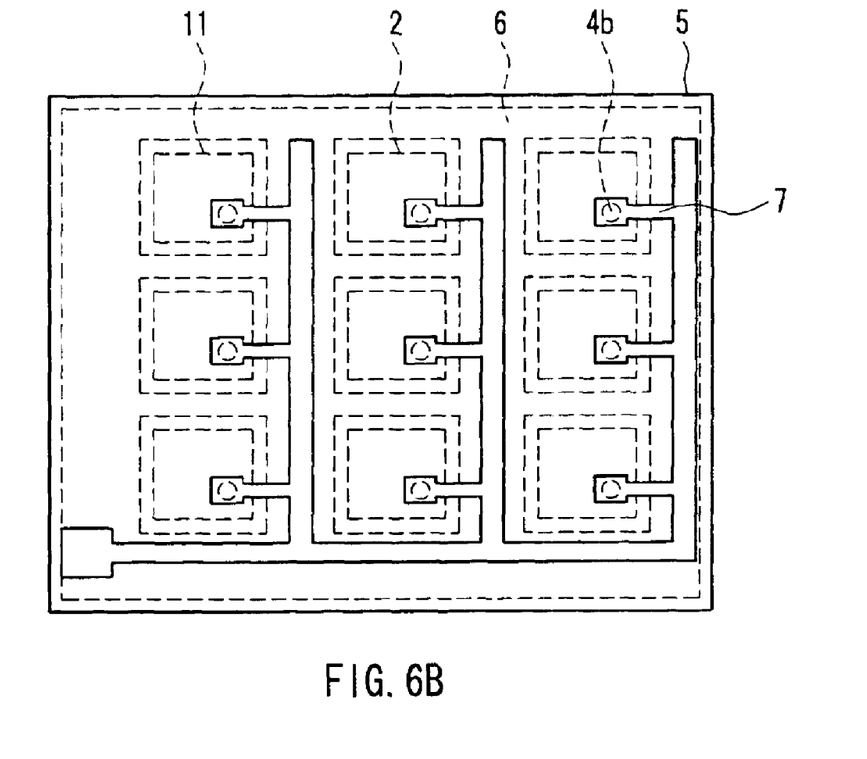
FIG. 6B is a plan view of the same light-emitting device.

FIG. 6A is a cross-sectional view of a light-emitting device according to Embodiment 6 of the present invention. FIG. 6B is a plan view thereof. The support substrate 1 has conductivity by being made of, for example, aluminum, and the concave portions 11 are formed in an array by press forming. The configuration of each light-emitting portion constituting the array is the same as that in Embodiment 5.

Among two terminal electrodes of each light-emitting diode 2, the terminal electrode 4a formed on a lower surface of the light-emitting diode 2 is connected to the support substrate 1, and the terminal electrode 4b formed on an upper surface of the light-emitting diode 2 is connected to the electrode pattern 7 on the transparent film 5.

According to the above-mentioned configuration, a light-emitting device with large electric power can be realized, which is equivalent to a general illumination device such as a fluorescent lamp and an electric light. Furthermore, the connections to the terminal electrodes 4a of the light-emitting diodes 2 and the terminal electrodes 4b thereof, respectively, are performed at the same time with the connection to the support substrate 1 and the electrode pattern 7 on the transparent film 5. This makes it unnecessary to perform wire bonding and coating of a phosphor for each light-emitting diode 2. Consequently, the production cost can be reduced remarkably.

In the configuration described in Embodiments 1 to 6, a space in the surrounding of the light-emitting diode 2 surrounded by the support substrate 1 and the transparent film 5 can be provided with various atmospheres in accordance with the condition from the practical point of view. For example, air at an atmospheric pressure may be sealed in the space. Furthermore, gas may be sealed in the space at a pressure (for example, in a range of $1\times10^3$ to $5\times10^4$ Pa) lower than the atmospheric pressure. Because of this, the transparent film 5 is pressed to the support substrate 1 side in an upper portion of the light-emitting diode 2. Therefore, the transparent film 5 is fixed stably, which enhances long-term reliability. Furthermore, the gas to be sealed in desirably is inactive gas such as nitrogen, argon, helium, and the like, and mixtures thereof. This prevents an ultraviolet component of light from the light-emitting diode 2, from causing oxygen and moisture in the air to react with the electrode of the light-emitting diode and the surface of the transparent film to degrade reliability. Inactive gas such as nitrogen, argon, helium and the like may be sealed in the space at an atmospheric pressure or higher.

Embodiment 7

Figure 7:
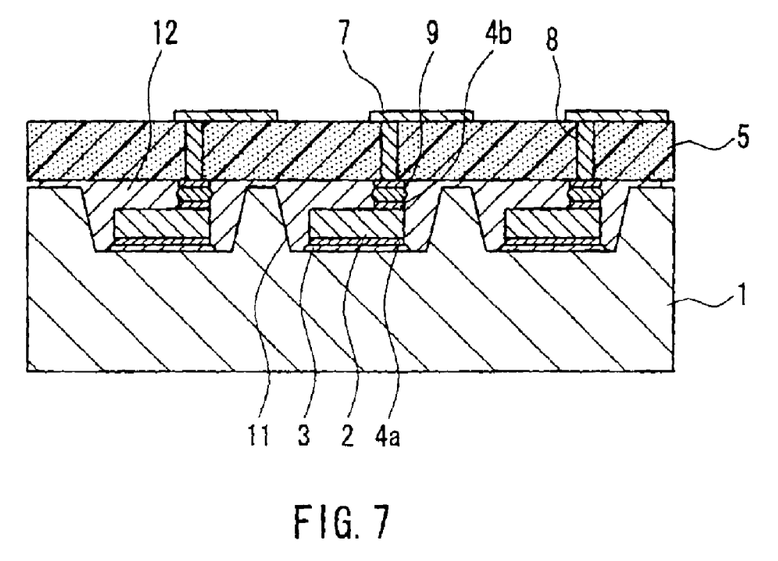
FIG. 7 is a cross-sectional view of a light-emitting device according to Embodiment 7 of the present invention.

FIG. 7 is a cross-sectional view of a light-emitting device according to Embodiment 7 of the present invention. Embodiment 7 is different from Embodiment 6 in that resin 12 is sealed in the space in the surrounding of the light-emitting diode 2. When the resin 12 is sealed in the space, the light-emitting diode 2 is fixed to the support substrate 1 stably.

The resin 12 desirably has a refractive index between that of a light-emitting layer of the light-emitting diode 2 and that of the transparent film 5. This can enhance the light extraction efficiency from the light-emitting diode 2. The relationship among the refractive indexes may be, for example, light-emitting diode: 2.6, resin: 2.0, and transparent film: 1.6. Furthermore, the resin 12 may contain a phosphor in the same way as in the transparent film 5. Because of this, a conversion efficiency to white light can be enhanced further, so that a light-emitting device with a high efficiency can be realized.

In the present embodiment, the case where the light-emitting diodes 2 are placed in an array on the support substrate 1 having the concave portions 11 has been described. However, the present invention is not limited thereto. For example, in the configurations described in Embodiments 1 to 5, resin may be sealed in the space in the surrounding of the light-emitting diode 2, whereby the same effect can be obtained.

In the above-mentioned embodiments, there is no particular limit to the material for the support substrate 1. However, in particular, metal such as aluminum, copper, and the like desirably is used. This can ensure excellent radiation of heat, and enhance a working temperature and reliability.

Furthermore, there is no particular limit to the thickness of the transparent film. However, in order to satisfy both mechanical stability and flexibility during mounting, the thickness of the transparent film desirably is about 25 μm to less than 500 μm.

Furthermore, the pattern of the electrode on the transparent film can be designed freely in accordance with the type of connection between the light-emitting device and an external driving circuit. It should be noted that the line width of the electrode should be set small so as to minimize the shielding against light in a place immediately above and in the surrounding of the light-emitting diode where light from the light-emitting diode and the phosphor passes. The line width desirably is less than 100 μm.

Furthermore, in the above-mentioned embodiments, a blue light-emitting diode, for example, with a wavelength of about 470 mm can be used. However, the present invention is not limited thereto. For example, a light-emitting diode in an ultraviolet region with a wavelength of 420 nm or less is used, and as phosphors to be contained in the transparent film, those which emit light in red, yellow, blue, green, and the like are selected and mixed in an appropriate ratio, whereby white light closer to natural light can be obtained.

Furthermore, the means for fixing the transparent film to the support substrate is not limited to an adhesive. The transparent film also can be fixed by a mechanical holding structure. For example, a groove may be formed in a substrate, and a transparent film may be embedded to be fixed in the groove. The means for mounting the light-emitting diode is not limited to a silver paste. The light-emitting diode may be mounted with eutectic solder such as PbSn, AuSn, and the like. As the semiconductor light-emitting element, for example, a plane-emitting laser can be used instead of a light-emitting diode.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A light-emitting device comprising:
   a support substrate,
   a semiconductor light-emitting element mounted on the support substrate,
   a transparent film fixed to the support substrate so as to cover the semiconductor light-emitting element with a space defined by the support substrate and the transparent film surrounding the semiconductor light-emitting element, and
   an electrode pattern formed on an upper surface of the transparent film,
   wherein the electrode pattern is electrically connected to terminal electrodes of the semiconductor light-emitting element with a bump,
   the bump has a size smaller than a size of the semiconductor light emitting-element, and
   the electrode pattern formed on the transparent film extends above the semiconductor light-emitting element, and the portion of the electrode positioned above the semiconductor light-emitting element has a line shape with a width smaller than a width of the semiconductor light-emitting element.

2. The light-emitting device according to claim 1, wherein the transparent film contains a phosphor excited by light emitted from the semiconductor light-emitting element.

3. The light-emitting device according to claim 1, wherein a phosphor film containing a phosphor excited by light emitted from the semiconductor light-emitting element is formed on at least one surface of the transparent film.

4. The light-emitting device according to claim 3, wherein the phosphor film is formed on a surface of the transparent film on the semiconductor light-emitting element side.

5. The light-emitting device according to claim 1, wherein the support substrate has a concave portion, and the semiconductor light-emitting element is mounted in the concave portion.

6. The light-emitting device according to claim 5, wherein a side wall surface of the concave portion is formed so as to spread outwardly from a bottom portion toward the transparent film.

7. The light-emitting device according to claim 6, wherein an angle formed by the side wall surface of the concave portion and an upper surface of the support substrate is in a range of 30° to 60°.

8. The light-emitting device according to claim 1, wherein at least one of the terminal electrodes of the semiconductor light-emitting element is electrically connected to the support substrate or an electrode formed on the support substrate.

9. The light-emitting device according to claim 1, wherein a plurality of the semiconductor light-emitting elements are mounted in an array on the support substrate.

10. The light-emitting device according to claim 1, wherein the transparent film is fixed to the support substrate with an adhesive.

11. The light-emitting device according to claim 10, wherein the adhesive contains a phosphor excited by light emitted from the semiconductor light-emitting element.

12. The light-emitting device according to claim 1, wherein the support substrate is made of metal.

13. The light-emitting device according to claim 1, wherein resin is sealed in a space surrounded by the support substrate and the transparent film.

14. The light-emitting device according to claim 13, wherein the resin sealed in the space contains a phosphor excited by light emitted from the semiconductor light-emitting element.

15. The light-emitting device according to claim 13, wherein a refractive index of the resin sealed in the space is smaller than that of a light-emitting portion of the semiconductor light-emitting element and larger than that of the transparent film.

16. The light-emitting device according to claim 1, wherein gas is sealed in the space surrounded by the support substrate and the transparent film at a pressure lower than an atmospheric pressure.

17. The light-emitting device according to claim 1, wherein inactive gas is sealed in the space surrounded by the support substrate and the transparent film.

18. The light-emitting device according to claim 17, wherein the inactive gas is selected from the group consisting of nitrogen, argon, helium, and a mixture thereof.

* * * * *